(12) United States Patent
Lung (10) Patent No.: US 7,504,653 B2
(45) Date of Patent: Mar. 17, 2009

(54) MEMORY CELL DEVICE WITH CIRCUMFERENTIALLY-EXTENDING MEMORY ELEMENT

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 112 days.

(21) Appl. No.: 11/538,677

(22) Filed: Oct. 4, 2006

(65) Prior Publication Data

US 2008/0099791 A1   May 1, 2008

(51) Int. Cl.
*H01L 29/02* (2006.01)
(52) U.S. Cl. ............................................. 257/2; 257/4
(58) Field of Classification Search .................... 257/2, 257/3, 4
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,515,488 | A | 5/1996 | Hoppe et al. |
| 5,534,712 | A | 7/1996 | Ovshinsky et al. |
| 5,550,396 | A | 8/1996 | Tsutsumi et al. |
| 5,687,112 | A | 11/1997 | Ovshinsky |
| 5,789,277 | A | 8/1998 | Zahorik et al. |
| 5,789,758 | A | 8/1998 | Reinberg |
| 5,814,527 | A | 9/1998 | Wolstenholme et al. |

(Continued)

FOREIGN PATENT DOCUMENTS

WO   WO 00/45108 A1   8/2000

(Continued)

OTHER PUBLICATIONS

Ahn et al., Highly Reliable 50nm Contact Cell Technology for 256Mb PRAM, 2005 Symposium on VLSI Technology Digest of Technical Papers, pp. 98-99.*

(Continued)

*Primary Examiner*—Mark Prenty
(74) *Attorney, Agent, or Firm*—James F. Hann; Haynes Beffel & Wolfeld LLP (57) ABSTRACT

A memory cell device, including a memory material switchable between electrical property states by the application of energy, has bottom and top electrode members and a dielectric material between the two. The bottom and top electrode members have outer, circumferentially-extending surfaces aligned with one another. A memory element, comprising the memory material, at least partially surrounds and electrically contacts the outer surfaces of the top and bottom electrode members to create a memory element transition region at the dielectric material. In some embodiments the top and bottom electrode members and the dielectric element define a stack of material, the stack of material having a length extending in a direction between the top and bottom electrodes and through the dielectric element and a sub lithographically dimensioned width extending perpendicular to the length.

14 Claims, 6 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,214,958 B2 | 5/2007 | Happ |
| 7,220,983 B2 | 5/2007 | Lung |
| 2002/0070457 A1 | 6/2002 | Sun et al. |
| 2002/0072223 A1 | 6/2002 | Gilbert et al. |
| 2002/0113273 A1 | 8/2002 | Hwang et al. |
| 2004/0051094 A1 | 3/2004 | Ooishi |
| 2004/0178172 A1 | 9/2004 | Huang et al. |
| 2004/0248339 A1 | 12/2004 | Lung |
| 2005/0029502 A1 | 2/2005 | Hudgens |
| 2005/0062087 A1 | 3/2005 | Chen et al. |
| 2005/0093022 A1 | 5/2005 | Lung |
| 2005/0106919 A1 | 5/2005 | Layadi et al. |
| 2005/0130414 A1 | 6/2005 | Choi et al. |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |

| | | |
|---|---|---|
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0235811 A1 | 10/2007 | Furukawa et al. |
| 2007/0257300 A1 | 11/2007 | Ho et al. |
| 2007/0298535 A1 | 12/2007 | Lung |
| 2008/0014676 A1 | 1/2008 | Lung et al. |
| 2008/0099791 A1* | 5/2008 | Lung .......................... 257/213 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, David, "Amorphous-Semiconductor Devices," Sci. Amer., vol. 236, pp. 36-48, May 1977.
Adler, D. et al., "Threshold Switching in Chalcogenide-Glass Thin Films," J. Appl/Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6. 2005.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S.L. et al., "Highly Scalable On-axis Confined Cell Structure for High Density PRAM beyond 256Mb," 2005 Symposium on VLSI Technology Digest of Technical Papers, pp. 96-97.
Gibson, G.A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
"Magnetic Bit Boost," www.sciencenews.org, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, http://klabs.org/richcontent/MAPLDCon99/Papers/P21_Tyson_P PDF#search='nonvolatile%20high%20density%20high%20perform ance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

* cited by examiner

MEMORY CELL DEVICE WITH CIRCUMFERENTIALLY-EXTENDING MEMORY ELEMENT

CROSS REFERENCE TO RELATED APPLICATIONS

This application is related to the following US patent applications: application Ser. No. 11/375,942 filed on 15 Mar. 2006 entitled Pipe Shaped Phase Change Memory; Application No. 60/752,138 filed on 19 Dec. 2005 entitled Phase Change Memory Cell and Manufacturing Method; and application Ser. No. 11/375,816 filed on 15 Mar. 2006 entitled Manufacturing Method for Pipe-Shaped Electrode Phase Change Memory

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive or other memory material, like phase change based memory materials, and to methods for manufacturing such devices.

2. Description of Related Art

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

SUMMARY OF THE INVENTION

One embodiment of the present invention has a memory cell device of the type including a memory material switchable between electrical property states by the application of energy. The memory cell device comprises bottom and top electrode members and a dielectric material between the two. The bottom electrode member has an outer, circumferentially-extending surface. The top electrode member overlies the bottom electrode member and has an outer, circumferentially-extending surface generally aligned with the outer surface of the bottom electrode member. A memory element, comprising a memory material, at least partially surrounds and electrically contacts the outer surfaces of the top and bottom electrode members to create a memory element transition region at the dielectric material. In some embodiments the top and bottom electrode members and the dielectric element define a stack of material, the stack of material having a length extending in a direction between the top and bottom electrodes and through the dielectric element and a width extending perpendicular to the length, the width being a sub lithographically dimensioned width. In some embodiments the memory element is tubular.

One example of a method for making a memory cell device, of the type including a memory material switchable between electrical property states by the application of energy, proceeds as follows. A memory cell access layer is formed with the comprising a bottom electrode and an upper surface, the bottom electrode having a bottom electrode surface at the upper surface. A stack of material, having a circumferentially extending outer surface, is formed on the bottom electrode surface with a dielectric material layer captured between upper and lower layers of electrically conductive material. The lower layer of material contacts the bottom electrode surface. A layer of a memory material is formed on the outer surface to at least partially surround the stack of material. The layer of memory material is surrounded with a dielectric material. A top electrode is formed to be in contact with the upper layer of material of the stack of material. In some embodiments the stack of material forming step comprises the following steps. A first layer of a first electrically conductive material is deposited on the upper surface of the memory cell access layer. A layer of a dielectric material is deposited on the first layer. A second layer of a second electrically conductive material is deposited on the layer of dielectric material. A mask is formed over the second layer, the mask being aligned with the bottom electrode surface. The mask is trimmed to create a sub lithographically dimensioned trimmed mask. Material not covered by the trimmed mask is removed to create a sub lithographically dimensioned stack of material.

An integrated circuit including a memory array is described comprising a plurality of such memory cell devices with access transistors, arranged in a high density array of rows and columns. The access transistors comprise source and drain regions in a semiconductor substrate, and a gate coupled to word lines along rows of memory cells. The memory cells are formed in a layer above the access transistors on the integrated circuit, with a bottom electrode contacting the drain of a corresponding access transistor. Bit lines are formed using a layer of metallization above the memory cells contacting the top electrodes on the memory devices along columns of memory cells in the array. In an embodiment described, two rows of memory cells share source contacts, with a common source line coupled to the source contact and extending generally parallel to the word lines through the array.

A reliable memory cell structure is provided with a low reset current, which is manufacturable using the standard lithographic and deposition processes. The cell structure is particularly suited to integration with CMOS circuitry on a large scale integrated circuit device.

Other aspects and advantages of the technology described herein can be understood with reference to the figures and the detailed description which follow.

DETAILED DESCRIPTION

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 1:
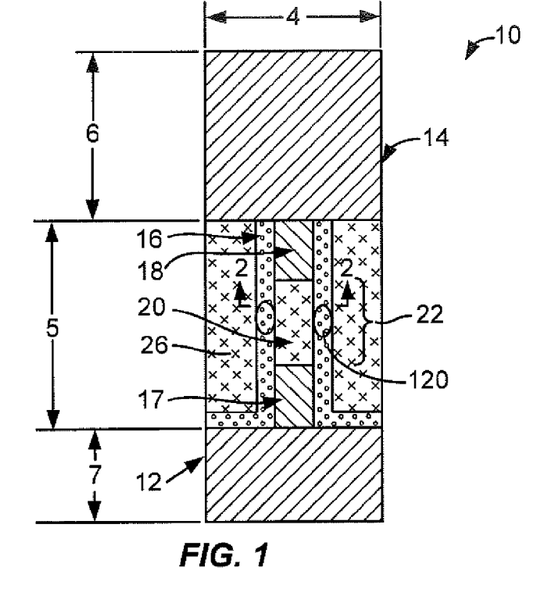
FIG. 1 is a cross-sectional view of an embodiment of a memory cell device in which the memory element comprises a circumferentially-extending portion surrounding a dielectric material as well as bottom and top electrode extensions.

FIG. 1 is a simplified cross-sectional view of a memory cell device 10. Device 10 includes a bottom or first electrode 12 and a top or second electrode 14 connected by a circumferentially extending, sometimes called pipe-shaped, memory element 16. Memory element 16, in this embodiment, surrounds bottom and top electrode members or extensions 17 and 18 and dielectric material 20, the dielectric material extending between electrode extensions 17, 18. Memory element 16 is also surrounded by a dielectric material 26. Therefore, memory element 16 has an interior housing bottom and top electrode extension 17, 18 and dielectric material 26.

The central portion 22 of memory element 16 acts as a transition region for the memory element. Assuming memory element is a phase change material such as GST, discussed below, the transition between or among different electrical property states will typically occur at this central portion 22 due at least in part to the better thermal isolation from electrodes 12, 14.

Figure 2:
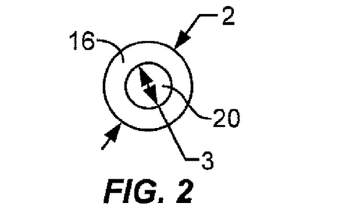
FIG. 2 is a simplified cross-sectional view of taken a long line 2-2 of FIG. 1.

In this embodiment memory material 16 is a tube-like, pipe-shaped, fully circumferentially extending structure. See FIG. 2. However, in some embodiments and under some processing procedures, memory material 16 may not extend completely around all or part of one or more of dielectric material 20, bottom electrode extension 17 and top electrode extension 18. The use of circumferentially extending memory material 16 increases the efficiency of memory material 16 by reducing the volume of the memory material that transitions between electrical property states when compared to a cylindrical volume of memory material. When memory material 16 is a phase change material, it reduces the power and current requirement for reset of the phase change material. In addition, better process uniformity after trimming (see FIGS. 9 and 10) is also achieved using circumferentially extending memory material 16.

Dielectric materials 20, 26 may include silicon oxide, silicon oxynitride, silicon nitride, $Al_2O_3$, other low K (low permitivity) dielectrics, or an ONO or SONO multi-layer structure. Alternatively, dielectric materials 20, 26 may comprise an electrical insulator including one or more elements selected from the group consisting of Si, Ti, Al, Ta, N, O, and C. In preferred devices, dielectric materials 20, 26 have a low thermal conductivity, less than about 0.014 J/cm*K*sec. In other preferred embodiments, when memory element 16 is made from a phase change material, one or both of the thermally insulating dielectric materials 20, 26 have a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric materials 20, 26 include $SiO_2$, SiCOH, polyimide, polyamide, and fluorocarbon polymers. Other examples of materials which are candidates for use for the thermally insulating dielectric materials 20, 26 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within dielectric materials 20, 26 can provide thermal and electrical insulation.

Typical dimensions for memory cell device 10 of FIG. 1 are as follows. Tubular memory element 16 preferably has a wall thickness of less than 30 nm, typically about 10 nm. Tubular memory element 16 preferably has an interior surface diameter 3 of less than 50 nm, typically about 30 nm. Tubular memory element 16 preferably has a length 5 of less than 100 nm, typically about 50 nm. Diameters 2, 4 are typically 40 nm and 90 nm respectively. Heights 6 and 7 are typically 50 nm and 40 nm respectively. Diameter 4 is typically a minimum lithographic size while diameter 3 is preferably a sub lithographic size achieved through the lithographic trimming procedure discussed with reference to FIGS. 8-10. Other dimensions and ranges of dimensions may also be used.

A memory cell device 10 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 16 that changes phase is small; and accordingly, the magnitude of the reset current required for changing the phase is very small.

Embodiments of memory cell device 10 include phase change based memory materials, including chalcogenide based materials and other materials, for memory element 16. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Challecogenide Material $Ge_xSb_yTe_z$ x:y:z=2:2:5

Or other compositions with x: 0~5; y: 0~5; z: 0~10

GeSbTe with doping, such as N—, Si—, Ti—, O—, C—, Al—, Ta— and their composites, or other element doping may also be used.

Formation method: By PVD sputtering or magnetron-sputtering method with reactive gases of Ar, $N_2$, and/or He, etc at the pressure of 1 mtorr~100 mtorr. The deposition is usually done at room temperature. The collimater with aspect ratio of 1~5 can be used to improve the fill-in performance. To improve the fill-in performance, the DC bias of several ten to several hundred volts is also used. On the other hand, the combination of DC bias and the collimater can be used simultaneously.

The post deposition annealing treatment with vacuum or N2 ambient is sometimes needed to improve the crystallize state of challecogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magnetoresistance) Material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimater with an aspect ratio of 1~5 can be used to improve the fill-in performance. To improve the fill-in performance, the DC bias of several ten to several hundred volts is also used. On the other hand, the combination of DC bias and the collimater can be used simultaneously. A magnetic field of several tens of gauss to as much as a Tesla (10,000 gauss) may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO ($YBaCuO_3$, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x: 0~1; y: 0~1

Formation method:

1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several ten to several hundred volts is also used. If desired, they combination of DC bias and the collimater can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_{2/O2}$ etc. at the pressure of 1 mtorr~100 mtorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several ten to several hundred volts is also used. If desired, the combination of DC bias and the collimater can be used simultaneously. The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution at the rotation of less than 1000 rpm. After spin-coating, the wafer is put to wait the solid-state formation at room temperature or temperature of less than 200 C. The waiting time ranges from several minutes to days, depending on the temperature and on the formation conditions.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

Figure 3:
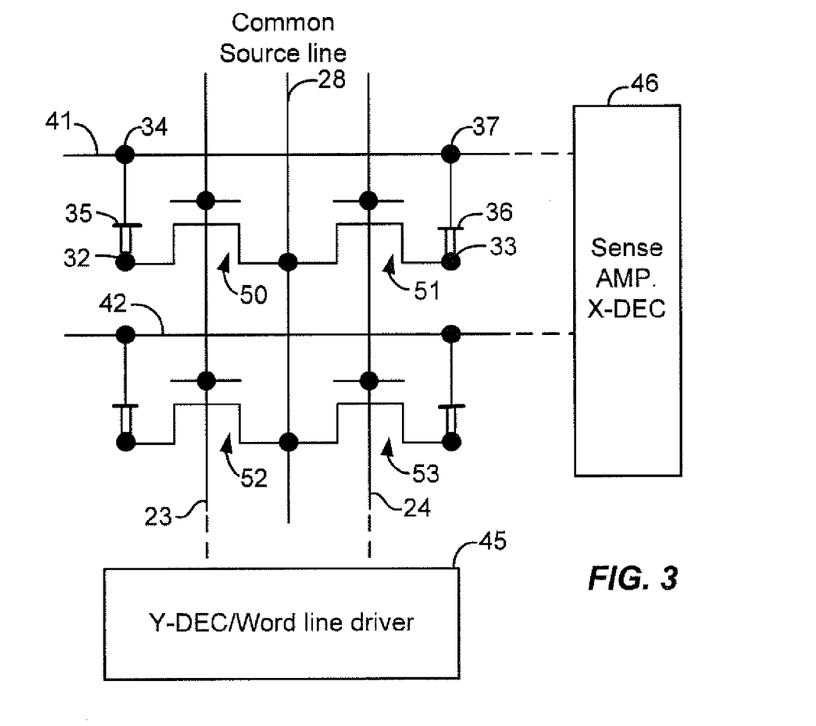
FIG. 3 is a circuit schematic of a memory array including memory cells like those shown in FIG. 1.

FIG. 3 is a schematic illustration of a memory array, which can be implemented as described herein. In the schematic illustration of FIG. 3, a common source line 28, a word line 23 and a word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and a set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the bottom electrode member 32 for memory element 35, which has top electrode member 34. The top electrode member 34 is coupled to the bit line 41. Likewise, the drain of access transistor 51 is coupled to the bottom electrode member 33 for memory element 36, which has top electrode member 37. The top electrode member 37 is coupled to the bit line 41. Access transistors 52 and 53 are coupled to corresponding memory elements as well on bit line 42. It can be seen that the common source line 28 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 4:
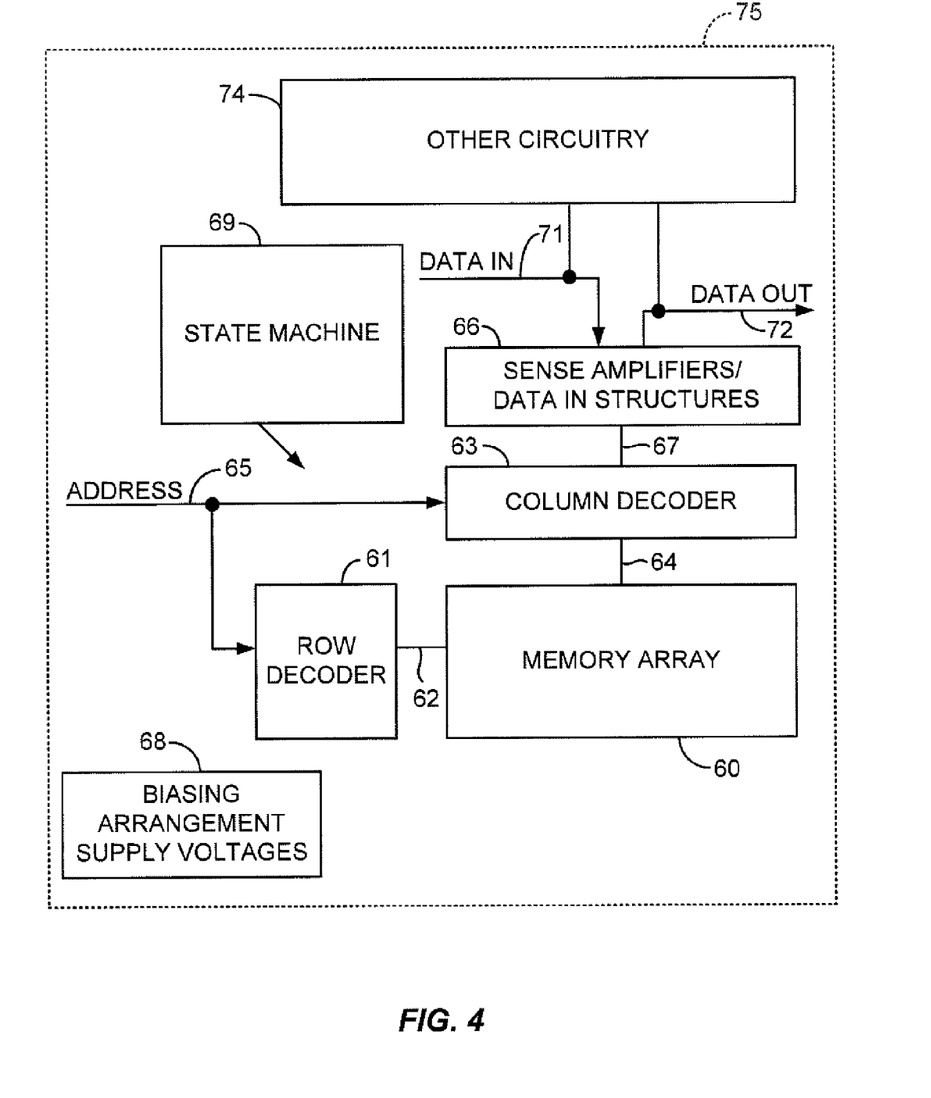
FIG. 4 is a block diagram of an integrated circuit device including memory cell devices as in FIG. 1 and other circuitry.

FIG. 4 is a simplified block diagram of an integrated circuit according to an embodiment of the present invention. The integrated circuit line 75 includes a memory array 60 implemented using circumferentially extending memory elements, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the side wall pin memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 5:
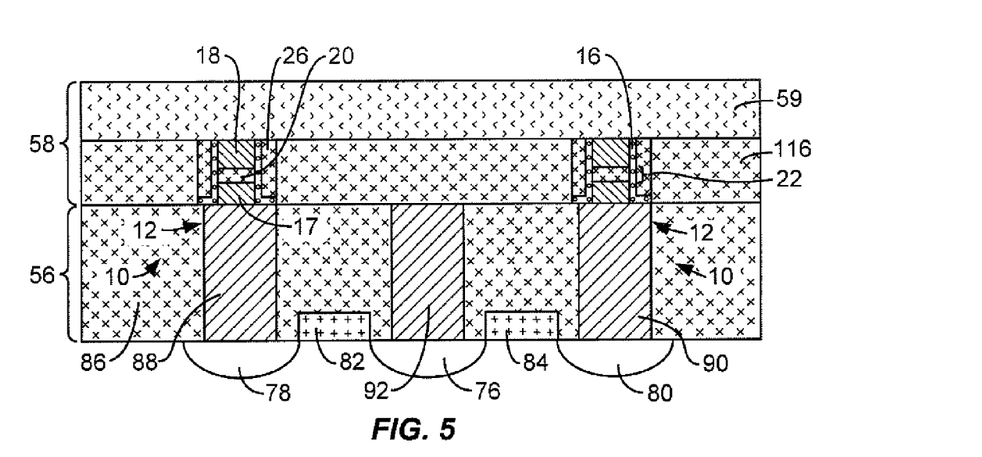
FIG. 5 is a cross-sectional view of a two cell array structure for an embodiment of the invention.

FIG. 5 depicts a cross-section of a pair of memory cell devices 10 formed on a semiconductor substrate. The structure of FIG. 5 includes a memory cell access layer 56 and a memory cell layer 58. Memory cell layer 58 includes a top electrode layer (bit line) 59 which, together with top electrode extensions 18, create the top electrodes 14 of FIG. 1. Isolation structures such as shallow trench isolation STI dielectric trenches (not shown) isolate pairs of rows of memory cell access transistors. The access transistors are formed by common source region 76 in the substrate, and drain regions 78 and 80 in the substrate. Polysilicon word lines 82 and 84 form the gates of the access transistors. A dielectric fill layer 86 is formed over the polysilicon word lines 82, 84. Contact plug structures 88 and 90 contact individual access transistor drains, and in the illustrated example, common source line 92 contacts source regions along a row in the array. In other embodiments, the common source line is implemented by a doped region in the substrate, such as an n+doped region with optionally a silicide on the surface. The plug structure 88 acts as a terminal contacting the access transistor for bottom electrode 12 of memory cell device 10. Plug structure 90 acts as a terminal contacting the access transistor for bottom electrode 12 of memory cell device 10.

It is preferred that all or part of the portions of bottom and top electrodes 12, 14 contacting memory element 16 comprise an electrode material, such as TiN, or another conductor selected for compatibility with the phase change material of memory element 16. In the embodiment of FIG. 1, top electrode 14, including top electrode extension 18, and bottom electrode extension 17 are all made of TiN while the remainder of bottom electrode 12 comprises tungsten. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. In some embodiments, such as described below with reference to FIGS. 16 and 17, all or parts of top and bottom electrode extensions 18, 17 may comprise a memory material, typically the same memory material as for memory element 16.

Figure 6:
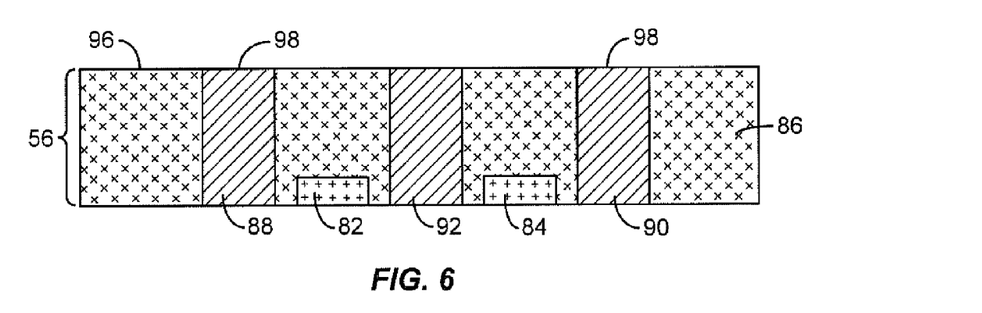
FIGS. 6-15 illustrate respective stages in a manufacturing process for a memory cell array structure as in FIG. 5.
Figure 7:
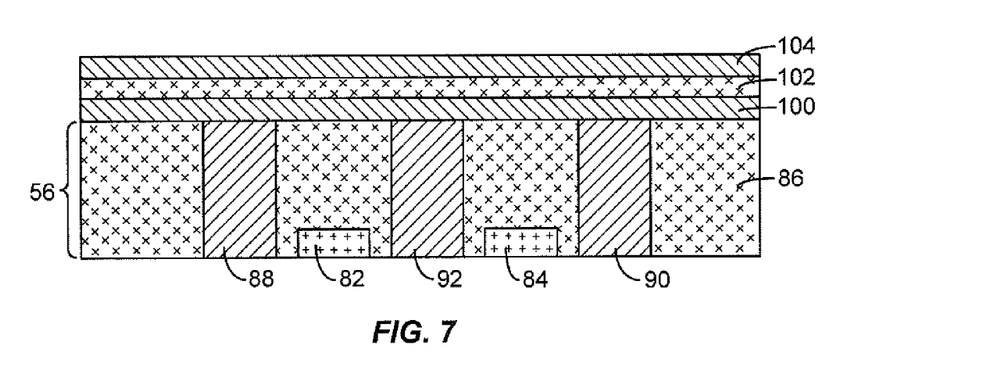
Figure 8:
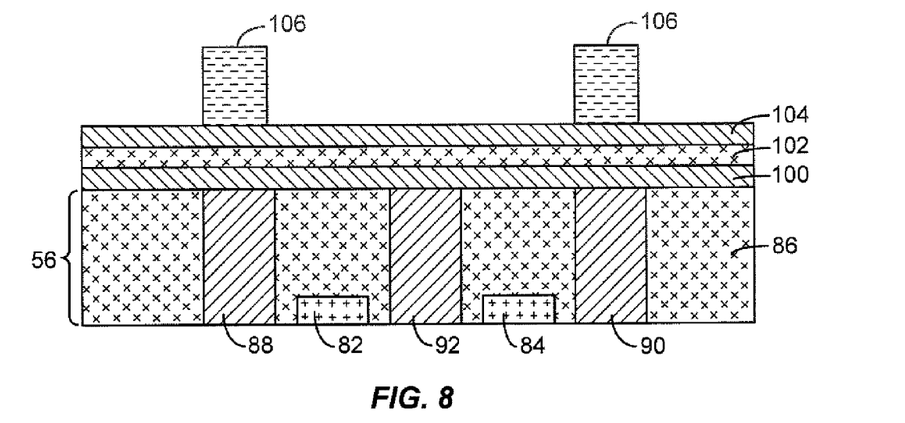

Memory cell device 10 and its method of manufacture will be described with reference to FIGS. 6-15 and then back to FIG. 5. Referring now to FIG. 6, memory cell access layer 56 is seen to have a generally flat upper surface 96. Upper surface 96 is partially defined by surfaces 98 at the ends of plugs 88, 90. Next, as shown in FIG. 7, a layer 100 of an electrode material is deposited on upper surface 96 followed by a dielectric material layer 102 and then another layer 104 of an electrode material. Layers 100, 102, 104 are used to create bottom electrode extension 17, dielectric material 20 and top electrode extension 18, respectively. FIG. 8 illustrates result of depositing a lithographic mask 106 on layer 104 aligned with electrode surfaces 98 of plugs 88, 90. Both plugs 88 and 90 and the associated masks 106 have generally cylindrical cross-sectional shapes; however, other cross-sectional shapes, regular or irregular polygons and shapes having curved and/or straight sections are also possible with other embodiments. The width of mask 106 is preferably the minimum lithographic size associated with the lithographic process used.

Figure 9:
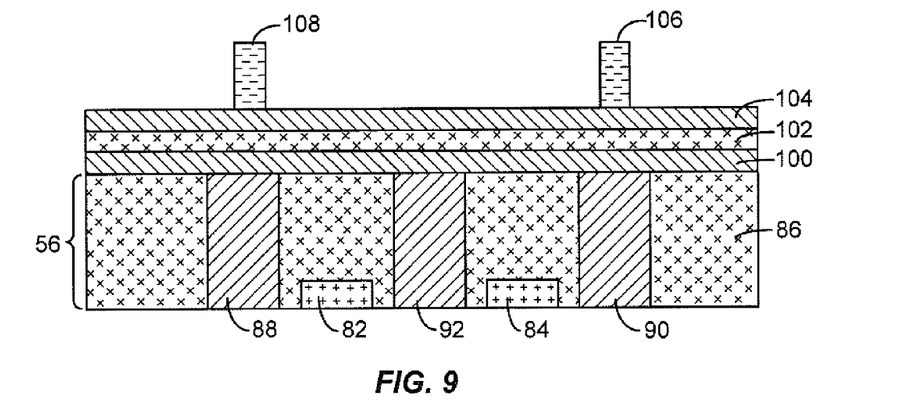

FIG. 9 illustrates results of a mask trimming step to reduce the lateral dimension, which is the width or diameter, of lithographic mask 106 to a sub lithographic dimension. The width or diameter of trimmed mask 108 is well below the minimum lithographic feature size used to create mask 106. Trimming is typically by a photoresist oxygen plasma trimming process but may be by other processes. For example, silicon oxide hard mask processing can also be used. See, for example, U.S. Pat. No. 6,869,542 which discusses hard mask integrated etch processing.

Figure 10:
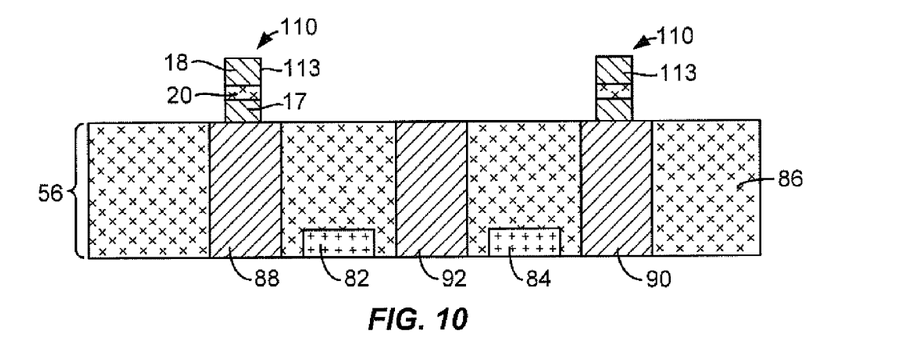

Those portions of layers 100, 102 and 104 not protected by trimmed lithographic mask 108 are shown in FIG. 10 to have been etched away leaving, in this embodiment, generally cylindrical stacks 110 of materials including bottom electrode extension 17, dielectric material 20 and top electrode extension 18.

Figure 11:
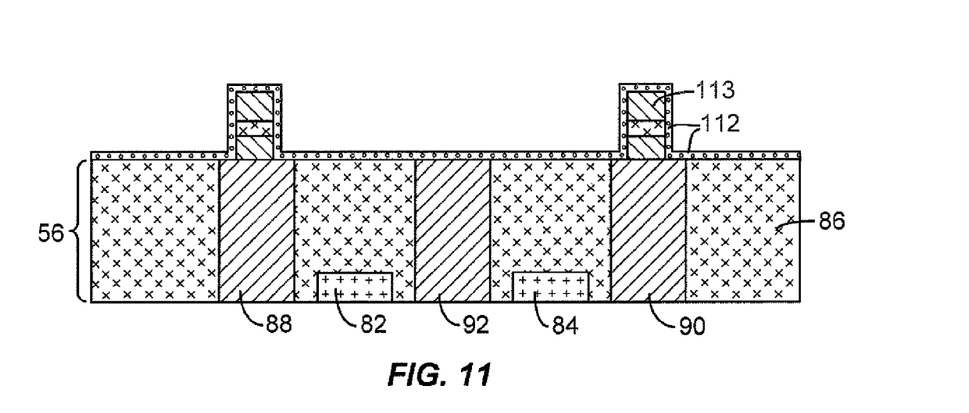
Figure 12:
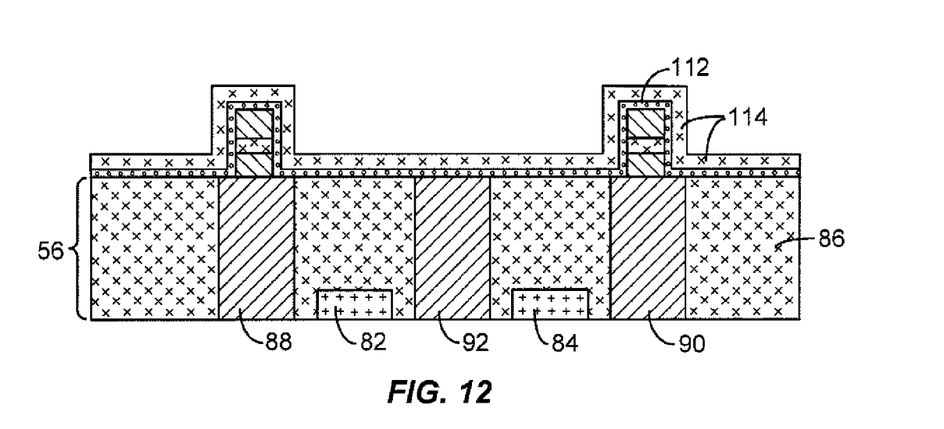

FIG. 11 illustrates result of the deposition of a layer 112 of a memory material, as discussed above typically GST, from which memory element to 16 is made. Layer 112 of memory material covers the circumferentially extending the outer surfaces 113 of material stacks 110 FIG. 12 shows results of the deposition of a layer 114 of a dielectric material onto layer 112. Dielectric material 26 is made from layer 114. Dielectric material 26 acts as a thermal isolation dielectric material. Thereafter, as shown in FIG. 13, excess dielectric material of layer 114 not needed for thermal isolation dielectric material 26 is removed by an anisotropic reactive ion etch to leave the side wall dielectric material 26.

Figure 13:
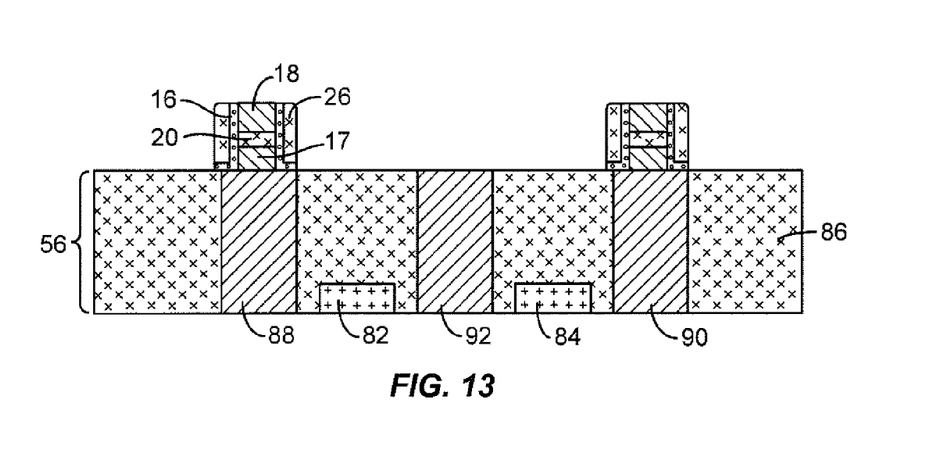
Figure 14:
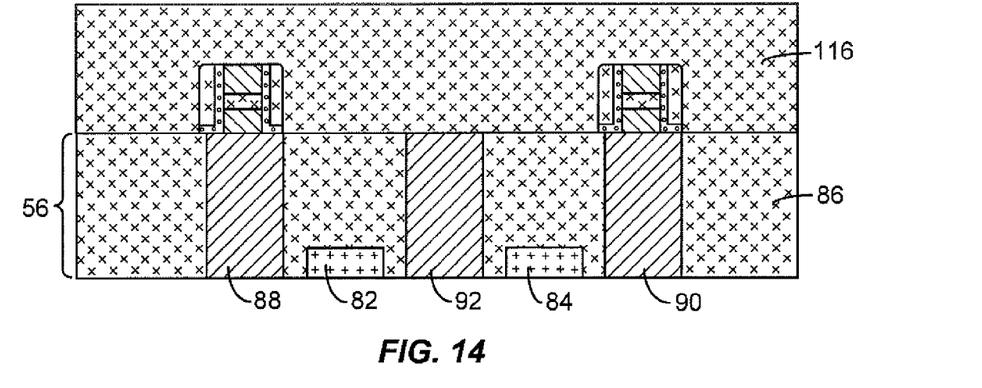

FIG. 14 illustrates results of a dielectric fill-in step in which a dielectric material 116, such as $SiO_2$, is deposited on the structure of FIG. 13. Two or more of dielectric materials 20, 26 (layer 114) and 116 may be the same material or may be different dielectric materials.

Figure 15:
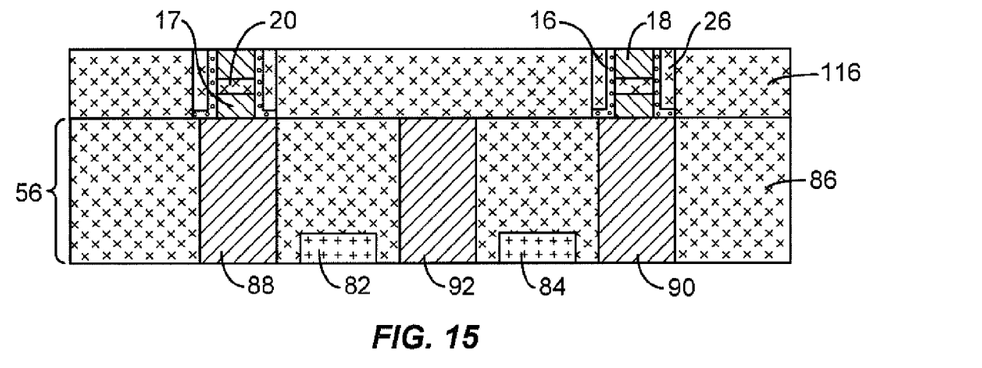

FIG. 15 shows the results of a chemical mechanical polishing procedure on the structure of FIG. 14. Thereafter electrode material is deposited on the structure of FIG. 15 to form top electrode layer 59 resulting in the structure of FIG. 5.

In operation, current flows on a path including a terminal in an access device in contact with plug 88, through bottom electrode 12, through memory element 16, and through top electrode 14. An active region 120, see FIG. 1, located along central portion 22 of memory element 16, is the location at which the phase change occurs due to heat caused by the current flow. Active region 120 is at this location because it is spaced apart from the bottom and top electrodes 12, 14, which act as heat sinks, as well as because it is thermally isolated through the use of dielectric materials 20 and 26. Active region 120 is very small, reducing the magnitude of current needed for reset.

Figure 16:
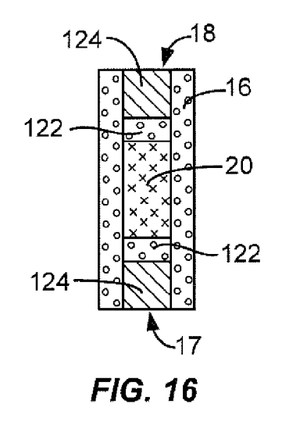
FIGS. 16 and 17 illustrate alternative embodiments of portions of the memory cell device of FIG. 1.
Figure 17:
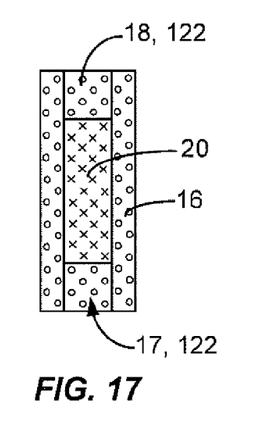

FIGS. 16 and 17 illustrate alternative embodiments of portions of the memory cell device 10 of FIG. 1. The structure of FIG. 16 differs from the structure of FIG. 1 in that memory element 16 is a straight cylinder, as opposed to a cylinder with a flange portion at bottom electrode 12. Each of bottom and top electrode extension 17 and 18 of the structure of FIG. 16 includes a memory material portion 122 and a TiN portion 124 to provide thermal isolation for the memory material relative to the electrodes. In FIG. 17 memory material portions 122 constitute the entire bottom and top electrode extensions 17, 18. In the embodiments of FIGS. 16 and 17, one or both of memory material portions 122 may be the same memory material used for memory element 16, but need not be so. The memory material for memory material portions 122 preferably has a lower thermal resistance than the memory material used for the side wall memory element 16.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations within the spirit of the invention and the scope of the following claims.

Any and all patents, patent applications and printed publications referred to above are incorporated by reference.

What is claimed is:

1. A memory cell device of the type including a memory material switchable between electrical property states by the application of energy, the memory cell device comprising:
   a bottom electrode member having an outer, circumferentially-extending surface;
   a top electrode member overlying the bottom electrode member, the top electrode member having an outer, circumferentially-extending surface generally aligned with the outer surface of the bottom electrode member;
   a dielectric material between the bottom and top electrodes; and
   a memory element comprising a memory material, the memory element at least partially surrounding and electrically contacting the outer surfaces of the top and bottom electrode members to create a memory element transition region at the dielectric material;
   whereby energy passing between the first and second electrodes is concentrated within the memory material at the transition region so to facilitate changing an electrical property state of the memory material.

2. The memory cell device according to claim 1 further comprising a bottom electrode, the bottom electrode member being an extension of the bottom electrode.

3. The memory cell device according to claim 2 wherein the bottom electrode and the bottom electrode member are of the same material.

4. The memory cell device according to claim 2 wherein the bottom electrode and the bottom electrode member are of different materials.

5. The memory cell device according to claim 1 wherein the bottom electrode member comprises at least one of TiN and $Ge_2Sb_2Te_5$.

6. The memory cell device according to claim 1 wherein the top and bottom electrode members and the dielectric material define a stack of material, the stack of material having a length extending in a direction between the top and bottom electrode members and through the dielectric material and a width extending perpendicular to the length, the width being a sub lithographically dimensioned width.

7. The memory cell device according to claim 1 wherein the memory element comprises a tubular memory element.

8. The memory cell device according to claim 7 wherein the tubular memory element has a wall, the wall having a wall thickness of less than 30 nm.

9. The memory cell device according to claim 7 wherein the tubular memory element has a thickness of about 10 nm.

10. The memory cell device according to claim 7 wherein the tubular memory element has an interior surface with a diameter of less than 50 nm.

11. The memory cell device according to claim 7 wherein the tubular memory element has an interior surface with a diameter of about 30 nm.

12. The memory cell device according to claim 7 wherein the tubular memory element has a length, the length being less than 100 nm.

13. The memory cell device according to claim 7 wherein the tubular memory element has a length, the length being about 50 nm.

14. The memory cell device according to claim 1 wherein the memory material comprises $Ge_2Sb_2Te_5$.

* * * * *